United States Patent [19]

Wu

[11] Patent Number: 5,608,557
[45] Date of Patent: Mar. 4, 1997

[54] CIRCUITRY WITH GATE LINE CROSSING SEMICONDUCTOR LINE AT TWO OR MORE CHANNELS

[75] Inventor: I-Wei Wu, Los Altos, Calif.

[73] Assignee: Xerox Corporation, Stamford, Conn.

[21] Appl. No.: 367,984

[22] Filed: Jan. 3, 1995

[51] Int. Cl.$^6$ .................................................. G02F 1/1343
[52] U.S. Cl. ................................................. 349/42; 257/72
[58] Field of Search ............................... 359/59; 257/72, 257/350, 208, 210, 211

[56] References Cited

U.S. PATENT DOCUMENTS

| | | | |
|---|---|---|---|
| 4,623,908 | 11/1986 | Oshima et al. | 357/23 |
| 5,159,477 | 10/1992 | Shimada et al. | 359/59 |
| 5,367,392 | 11/1994 | Janai | 359/59 |
| 5,412,493 | 5/1995 | Kunii et al. | 359/59 |
| 5,414,547 | 5/1995 | Matsuo et al. | 359/67 |
| 5,491,347 | 2/1996 | Allen et al. | 257/59 |
| 5,515,187 | 5/1996 | Nakamura et al. | 359/59 |
| 5,518,805 | 5/1996 | Ho et al. | 428/213 |

OTHER PUBLICATIONS

Lewis, A., and Wu, I-W., "Polysilicon TFTs for Active Matrix Liquid Crystal Displays," *IEICE TRANSACTIONS*, vol. J76-C-11, No. 5, May 1993, pp. 211-226.

Wu, I-W., "High-definition displays and tecnhology trends in TFT-LCDs," *Journal of the SID*, vol. 2, No. 1, 1994, pp. 1-14.

Wu, I-W., "Polycrystalline Silicon Thin Film Transistors for Liquid Crystal Displays," Solid State Phenomena, vols. 37-38, 1994, pp. 553-564.

Wu, I-W., Stuber, S., Tsai, C. C., Yao, W., Lewis A., Fulks, R., Chiang, A., and Thompson, M., "Processing and Device Performance of Low-Temperature CMOS Poly-TFTs on 18.4-in.-Diagonal Substrates for AMLCD Application," SID 92 Digest, 1992, pp. 615-618.

*Primary Examiner*—Wael Fahmy
*Assistant Examiner*—Fetsum Abraham

[57] ABSTRACT

Circuitry formed at a surface of a substrate includes first and second lines in first and second layers of the circuitry. The first line includes semiconductor material and extends between first and second connecting points at which it connects electrically to other components. The second line is connected to receive a gate signal, and crosses the first line in two or more channel regions. The first line includes a channel in each channel region, and the channels are in series. The second line conducts the gate signal to all of the channel regions. The first line includes charge carrier sources and destinations positioned so that conductivity of the first line between the first and second connecting points is controlled by the gate signal. The first layer can be polysilicon, and the second layer can be polysilicon or metal. The first line can be undoped in the channel regions but heavily doped in other areas. Each of the first and second lines can include an angle of approximately 90° between two of the channel regions, forming a Crossed-L configuration. In an active matrix display or other array with M scan lines and N data lines, the first line can be connected to the nth data line and the second line can receive the gate signal from the mth scan line.

24 Claims, 9 Drawing Sheets

CIRCUITRY WITH GATE LINE CROSSING SEMICONDUCTOR LINE AT TWO OR MORE CHANNELS

BACKGROUND OF THE INVENTION

The present invention relates to circuitry formed on substrates. More specifically, the present invention relates to gate lines that control conductivity in semiconductor lines.

Lewis, A., and Wu, I-W., "Polysilicon TFTs for Active Matrix Liquid Crystal Displays," *IEICE TRANSACTIONS*, Vol. J76-C-II, No. 5, May 1993, pp. 211–226, describe fabrication of polysilicon (poly-Si) thin film transistors (TFTs) and poly-Si active matrix liquid crystal display (AMLCD) pixel designs. Section 2.3 describes process flow and device architectures in relation to FIG. 2, which shows TFT device cross-sections. FIG. 10 shows a typical AMLCD pixel, and section 4 discusses poly-Si TFT AMLCD pixel design issues. Of techniques to reduce leakage, the use of multiple gates in a TFT is the simplest; FIG. 11 illustrates the transfer characteristics of TFTs with 1, 2, 4, and 8 gates, all with the same total gate length.

Wu, I-W., "High-definition displays and technology trends in TFT-LCDs," *Journal of the SID*, Vol. 2, No. 1, 1994, pp. 1–14, describes various liquid crystal displays (LCDs), focusing on AMLCDs with TFTs. FIGS. 2–5 show general features of conventional TFT-AMLCDs. As described in relation to FIG. 3, TFTs act as switches controlled by gate electrodes, connecting data lines to pixel electrodes. FIG. 11 shows a schematic cross section of a poly-Si TFT AMLCD, described in section 7. FIG. 12 shows a double-gate poly-Si TFT to reduce leakage current.

SUMMARY OF THE INVENTION

The invention addresses the problem of laying out a multiple gate structure such as a multiple gate TFT. As described above, multiple gate TFTs are useful in reducing leakage currents in thin film structures. Some conventional techniques solve the multiple gate layout problem by providing a separate line for each gate, with each line extending laterally from an axial line that provides a gate signal. Other conventional techniques provide a gate signal line that crosses a crooked semiconductor line at multiple channels.

The invention is based on the discovery of a technique that solves the multiple gate layout problem by providing a gate line that crosses two or more channels that are in series. As a result, a multiple gate structure can be provided with only one gate line extending laterally from a line that provides a gate signal. The technique therefore allows a variety of multiple gate layouts, some of which are especially useful in laying out an array, such as for an AMLCD, an active matrix sensor or emitter, or a liquid crystal light valve (LCLV).

The technique can be implemented in a product that includes a substrate and circuitry formed at a surface of the substrate. The substrate can include a first line that extends between first and second connecting points at which it connects electrically to other components. The first line is in a layer of the circuitry that includes semiconductor material. A second line in another layer can be connected to receive a gate signal. The second line crosses the first line in two or more channel regions, in each of which the first line includes a channel. The channels are in series between the first and second connecting points. The second line is conductive, conducting the gate signal to all of the channel regions. The first line includes charge carrier sources and destinations positioned so that conductivity of the first line between the first and second connecting points is controlled by the gate signal conducted to the channel regions by the second line.

The substrate can be an insulating substrate and the circuitry can be thin film circuitry. The second line can be in a layer that includes semiconductor material such as polysilicon, and can have an end electrically connected to a conductive metal line that provides the gate signal. Or the second line can be in a layer that includes conductive metal, with the second line connected to receive the gate signal from a conductive metal line in the same layer. The first line can include polysilicon, with very light doping in the channel regions and much greater doping elsewhere. An insulating layer can isolate the first and second lines in the channel regions.

The channel regions can be substantially the same in size and shape. The first line can extend in a first direction through a first channel region and in a second, perpendicular direction through a second channel region. Conversely, the second line can extend in the second direction through the first channel region and in the first direction through the second channel region. Each line can include an angle of approximately 90° between the channel regions.

The technique can also be implemented in an array. A two-dimensional (2 D) array, for example, can include two sets of conductive lines extending in perpendicular directions, as illustrated by FIG. 3 of the Wu article described above. Each line extending in one direction can provide signals to a column of the array; each line extending in another direction can provide signals to a row of the array.

Conventionally, each row-column position in a 2 D array includes circuitry, sometimes called a "cell," that responds to or provides signals on the lines for the cell's row and column combination. Through one set of parallel lines, illustratively called "data lines," each cell receives or provides signals that determine or indicate its state. Through the other set of parallel lines, illustratively called "scan lines," each cell receives a signal that determines when the cell receives signals from or provides signals to its data line. The area of each cell that is bounded by data lines and scan lines, referred to herein as the "cell area," can serve as a transducer, providing or receiving signals to or from sources outside the array. Each cell's circuitry conventionally includes a semiconductor channel, and the conductivity of the channel is conventionally controlled by the scan signals, also referred to as "gate signals" by analogy to the gate of a transistor.

The technique can be implemented in an array that includes a substrate and array circuitry formed at a surface of the substrate. The array circuitry includes M scan lines extending approximately in a first direction and N data lines extending approximately in a second direction different than the first. For each value of m from 1 through M and for each value of n from 1 through N, the array circuitry includes a crossing region in which the mth scan line and the nth data line cross.

Cell circuitry for at least one of the crossing regions includes a component that has a data lead for receiving signals from or providing signals to the nth data line. The cell circuitry also includes a first line and a second line as described above. The first line is electrically connected to the nth data line at the first connecting point and to the data lead of the component at the second connecting point. The second line is connected to receive the gate signal from the mth scan line.

The channel regions can be between the edges of the nth data line, so that the first line can be between the nth data line and the substrate. Further, substantially all of the second line can be between the edges of the nth data line, and the second line can connect to the mth scan line in the crossing region.

The technique can further be implemented in a display. The component of each cell's circuitry can include a light transmissive cell electrode in the cell area, connected to the data lead. The display can also include a liquid crystal material positioned along the cell electrode so that data signals received by the cell electrode from the nth data line control light transmissivity of the liquid crystal material. As described above, the data signals can be received from the nth data line through the first line, under control of the gate signal from the mth scan line conducted to the channel regions by the second line.

The technique described above is advantageous because it permits very compact layout of a multiple gate structure. As described above, the structure can be laid out under a data line in an array. Therefore, the technique is especially advantageous in light transmissive, sensing, or emitting applications, such as displays, light valves, and sensors, because each cell's multiple gate structure need not occupy any of the cell's area. Also, each cell's semiconductor line that includes channels need not extend under the cell's scan line, so that all the area under the scan line is available for a capacitor. Further, the semiconductor line that includes channels is very effectively light shielded by the dataline.

The following description, the drawings, and the claims further set forth these and other aspects, objects, features, and advantages of the invention.

DETAILED DESCRIPTION

A. Conceptual Framework

Figure 1:
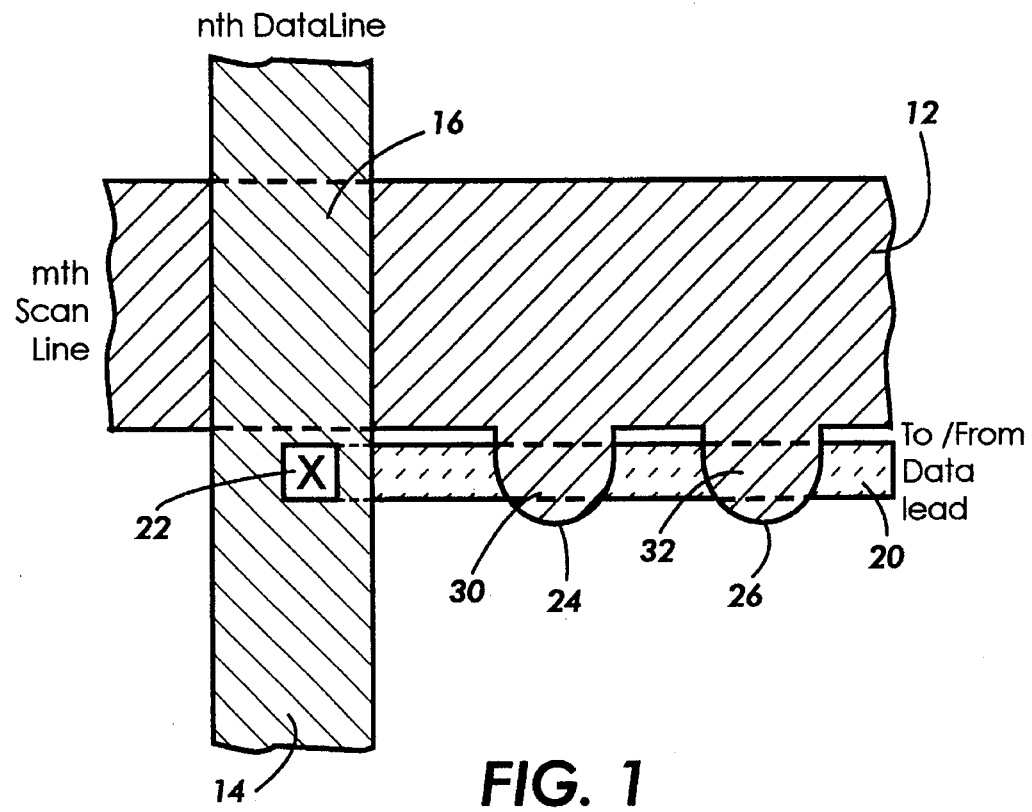
FIG. 1 is a schematic layout diagram showing prior art cell circuitry in which a metal or polysilicon scan line has laterally extending gate lines that cross channels in a semiconductor line.

The following conceptual framework is helpful in understanding the broad scope of the invention, and the terms defined below have the indicated meanings throughout this application, including the claims.

"Circuitry" or a "circuit" is any physical arrangement of matter that can respond to a first signal at one location or time by providing a second signal at another location or time, where the second signal includes information from the first signal. Circuitry "transfers" a first signal when it receives the first signal at a first location and, in response, provides the second signal at a second location.

Any two components are "connected" when there is a combination of circuitry that can transfer signals from one of the components to the other.

For example, two components are "connected" by any combination of connections between them that permits transfer of signals from one of the components to the other. Two components are "electrically connected" when there is a combination of circuitry that can transfer electric signals from one to the other. Two components could be electrically connected even though they are not physically connected, such as through a capacitive coupling.

A "substrate" or "chip" is a unit of material that has a surface at which circuitry can be formed or mounted. An "insulating substrate" is a substrate through which no electric current can flow.

A "layer" is a thickness of material formed over a surface and extending generally parallel to the surface, with one side toward the surface and another side away from the surface. A layer may include two or more layers within it, referred to as "sublayers." A layer may be homogeneous or its composition may vary.

To "etch" is to remove parts of one or more layers of material.

An "etchant" is a fluid used to etch.

To perform "physical vapor deposition" is to cause a material to be deposited on a physical structure without a chemical reaction. Examples include sputtering, vacuum evaporation, and e-beam deposition.

To perform "chemical vapor deposition" is to cause a material to be deposited on a physical structure by use of reactant gases and an energy source to produce a gas-phase chemical reaction. The energy source could be thermal, optical, or plasma in nature; "plasma enhanced chemical vapor deposition" uses a plasma energy source.

An operation "deposits" a layer by depositing material to form the layer, such as by physical or chemical vapor deposition.

To perform "lithography" is to use a radiation source to transfer a mask pattern to a layer of radiation-sensitive material and then to develop the radiation-sensitive material to obtain a positive or negative copy of the mask pattern. The transferred pattern that results from development may be referred to as a "pattern of mask material" if it is to be used for etching.

An "electric circuit" is a circuit within which components are electrically connected. An "electric structure" is a physical structure that includes one or more electric circuits.

A "thin-film structure" is an electric structure that is formed at a surface of an insulating substrate. A thin-film structure could be formed, for example, by deposition and patterned etching of films on the insulating substrate's surface.

During production of an electric structure at a surface, a part of a first layer "covers" or "has a shape that covers" or "is over" a part of a second layer if the part of the second layer is between the part of the first layer and the surface. Similarly, a part of a first layer "extends across" a part of a second layer if the part of the first layer covers the part of the second layer.

An "integrated circuit" is a circuit formed at a substrate's surface by batch processes such as deposition, lithography, etching, oxidation, diffusion, implantation, annealing, and so forth.

A "lead" is a part of a component at which the component is electrically connected to other components. A "line" is a simple component that extends between and electrically connects two or more leads. A line is "connected between" the components or leads it electrically connects. A lead of a component is "connected" to a lead of another component when the two leads are electrically connected by a combination of leads and lines. In an integrated circuit, leads of two components may also be "connected" by being formed as a single lead that is part of both components.

The terms "array" and "cell" are related: An "array" is an article of manufacture that includes an arrangement of "cells." For example, a "two-dimensional array" or "2 D array" includes an arrangement of cells in two dimensions. A 2 D array of circuitry may include rows and columns, with a line for each row and a line for each column. Lines in one direction may be "data lines" through which a cell receives or provides signals that determine or indicate its state. Lines in the other direction may be "scan lines" through which a cell receives a signal enabling it to receive signals from or provide signals to its data line.

In an array of circuitry, "cell circuitry" is circuitry connected to a cell's scan line and data line.

A "crossing region" is a region in which two lines cross, such as a scan line and a data line.

An "insulating layer" is a layer formed of a non-conductive material.

A part of a layer "has an edge" if another, complementary part of the layer has been removed by one or more processes, leaving the part of the layer. The edge is the boundary between part of a layer and its complementary part. A "width" of a part of a layer such as a line is a distance between two edges.

Edges of two layers or parts of layers in a thin-film structure are "approximately aligned" if their projections onto the surface of the substrate at which the thin-film structure is formed are approximately the same.

Edges of two layers or parts of layers are "slightly offset" from each other if their projections onto the surface of the substrate are at slightly different positions.

A component in one layer is "between" edges in another layer if the projection of the component onto the surface of the substrate is between the projections of the edges.

A "connected shape" in a thin-film structure formed at a surface of a substrate is a part of the structure that is formed from a layer and is bounded by an edge that extends between a first side toward the surface and a second side away from the surface.

A "channel" is a part of a component through which electric current can flow. A channel is "conductive" when the channel is in a state in which current can flow through it.

A line "includes" a channel when a part of the line is the channel.

Two channels in a line are "in series" with each other if both must be conductive for the line to be conductive.

A "channel lead" is a lead that connects to a channel. A channel may, for example, extend between two channel leads.

A "channel region" is a region of an electric structure in which a channel occurs.

A "charge carrier" is a real or fictitious particle that can transport charge through a channel to produce a current; electrons and holes are examples of charge carriers. A "charge carrier source" is an ion, atom, molecule, or other feature of a channel that can provide a charge carrier. A "charge carrier destination" is an ion, atom, molecule, or other feature of a channel that can neutralize or stop movement of a charge carrier. In an integrated circuit, an "n-channel" is a channel for which the majority of charge carrier sources provide charge carriers of negative sign such as electrons; a "p-channel" is a channel for which the majority of charge carrier sources provide charge carriers of positive sign such as holes.

Charge carrier sources and destinations are "positioned" so that an event occurs if the densities, types, or other characteristics of the sources and destinations vary with position in a way that causes the event to occur.

A "dopant" is an ion, atom, molecule, or other particle that can be added to a channel or other part of an integrated circuit during production and that serves as a charge carrier source when the integrated circuit is in use. An "n-type dopant" provides charge carriers of negative sign and a "p-type dopant" provides charge carriers of positive sign.

A process "implants" a dopant if the process causes particles of the dopant to enter a part of an integrated circuit.

A dopant "dopes" a part of a layer if the dopant is implanted in the part. A line is "doped" if it contains an implanted dopant.

An operation "forms" an electrical connection by producing an electrical structure through which current can flow between components. Deposition can form an electrical connection by producing a metal/semiconductor interface or a conductive metal line. Doping can form an electrical connection by producing a doped semiconductor line.

A "transistor" is a component that has a channel that extends between two channel leads, and that also has a third lead—referred to as a "gate lead" or simply "gate"—such that the channel can be switched between high impedance and low impedance by signals that change potential difference between the gate and one of the channel leads, referred to as the "source." The channel lead that is not the source is referred to as the "drain." Other components may have leads called gates, sources, and drains by analogy to transistors.

Signals on a line "control conductivity" of a channel if the signals can change conductivity of the channel. Such a line may be called a "gate line" and the signals may be called "gate signals."

Two components are electrically connected "under control of" a line if a signal on the line can change conductivity of another line connecting the two components. For example, a line that includes a channel can electrically connect two components under control of a gate line.

A "thin-film transistor" or "TFT" is a transistor that is part of a thin film structure.

A "capacitive element" is a component that stores a voltage level by storing charge. A capacitive element may include two conductive components, called "electrodes," separated by an insulating layer.

In a 2D array of circuitry, a cell's area may include a "cell electrode." A cell electrode may serve as one electrode of a capacitor whose other electrode is external to the array.

An "image" is a pattern of physical light.

An "image output device" is a device that can provide output defining an image.

A "display" is an image output device that provides information in a visible form.

A "liquid crystal cell" is an enclosure containing a liquid crystal material.

A "liquid crystal display" or "LCD" is a display that includes a liquid crystal cell with a light transmission characteristic that can be controlled in parts of the cell by an array of light control units to cause presentation of an image.

An "active matrix liquid crystal display" or "AMLCD" is a liquid crystal display that includes a liquid crystal cell and an array of cell circuitry that can cause presentation of an image by the liquid crystal cell.

B. Prior Art Techniques

Figure 2:
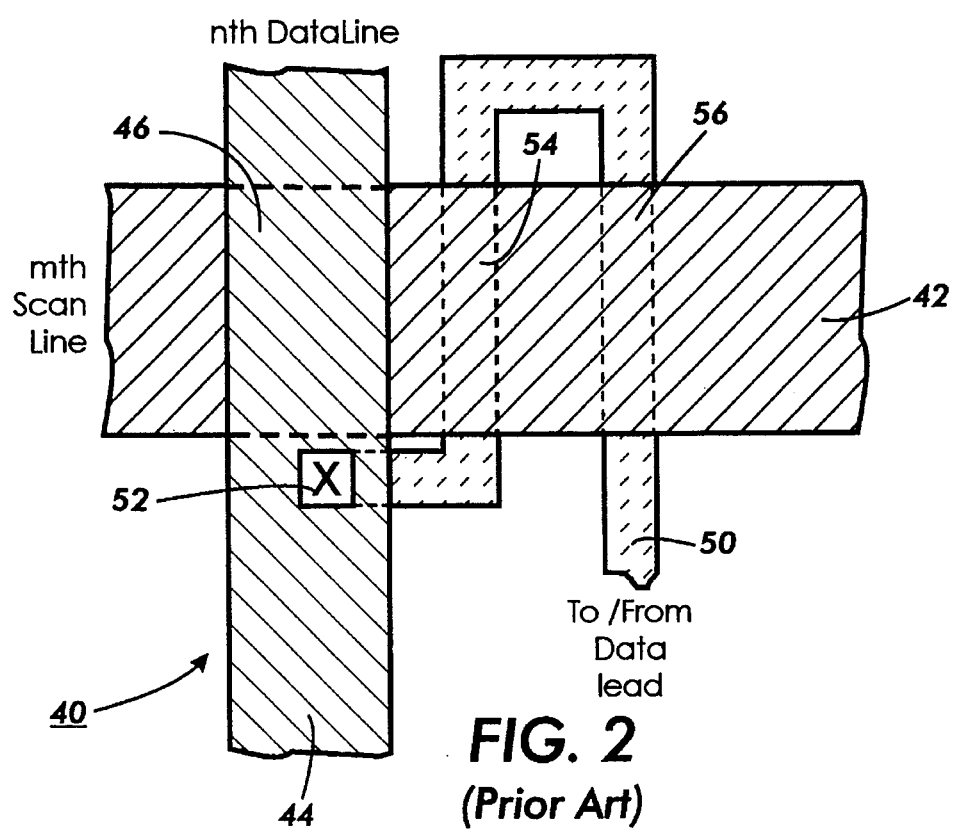
FIG. 2 is a schematic layout diagram showing prior art cell circuitry in which a metal or polysilicon scan line crosses channels in a crooked semiconductor line.

FIGS. 1 and 2 show prior art cell circuitry layouts. In FIG. 1, a scan line has laterally extending gate lines that cross channels in a semiconductor line. In FIG. 2, a scan line crosses channels in a crooked semiconductor line.

Circuitry 10 in FIG. 1 is illustratively from an array that includes M scan lines and N data lines. mth scan line 12 and nth data line 14 cross in crossing region 16. Cell circuitry connected to mth scan line 12 and nth data line 14 includes semiconductor line 20 with connection 22 to nth data line 14.

Gate lines 24 and 26 extend laterally from mth scan line 12, crossing channels 30 and 32 in semiconductor line 20. As a result, a gate signal on mth scan line 12 controls conductivity in channels 30 and 32, enabling semiconductor line 20 to provide signals from nth data line 14 to a data lead of a component in the cell circuitry or from the data lead to nth data line 14.

Circuitry 40 in FIG. 2 is illustratively from a similar array as FIG. 1, with mth scan line 42 and nth data line 44 cross in crossing region 46. Cell circuitry connected to mth scan line 42 and nth data line 44 includes crooked semiconductor line 50 with connection 52 to nth data line 44.

Because of the crook shape of semiconductor line 50, mth scan line 42 crosses channels 54 and 56. As a result, a gate signal on mth scan line 42 controls conductivity in channels 54 and 56, enabling semiconductor line 50 to provide signals from nth data line 44 to a data lead of a component in the cell circuitry or from the data lead to nth data line 44.

C. General Features of the Invention

Figure 3:
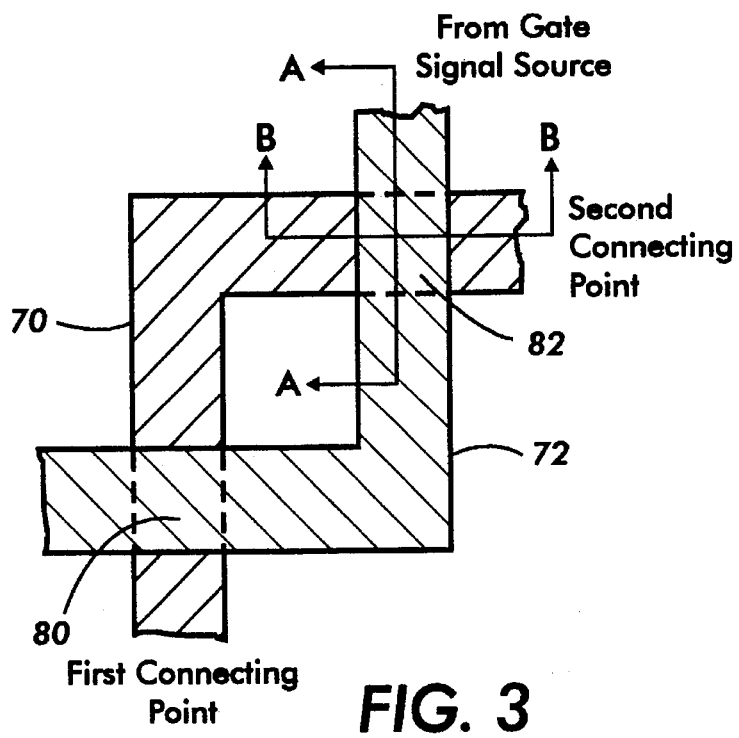
FIG. 3 is a schematic layout diagram showing cell circuitry with a single gate line that controls conductivity of two channels in a semiconductor line.
Figure 4:
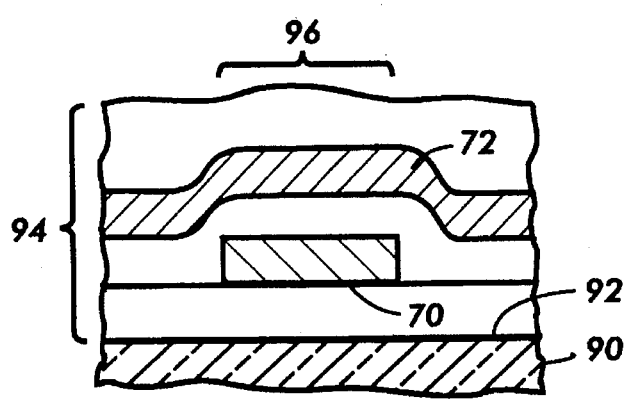
FIG. 4 is a schematic cross-section along line A—A in FIG. 3.
Figure 5:
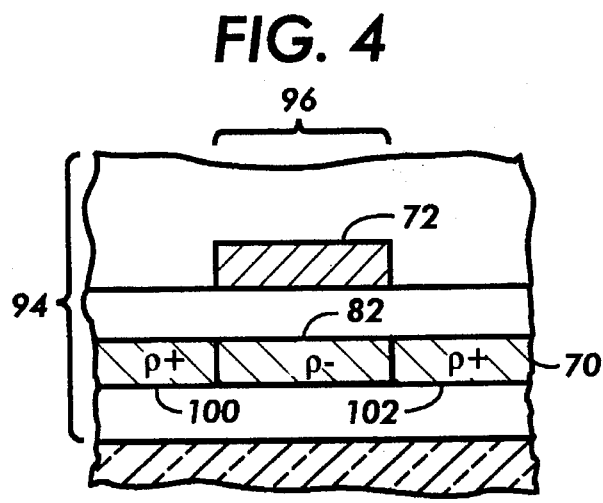
FIG. 5 is a schematic cross-section along line B—B in FIG. 3.
Figure 6:
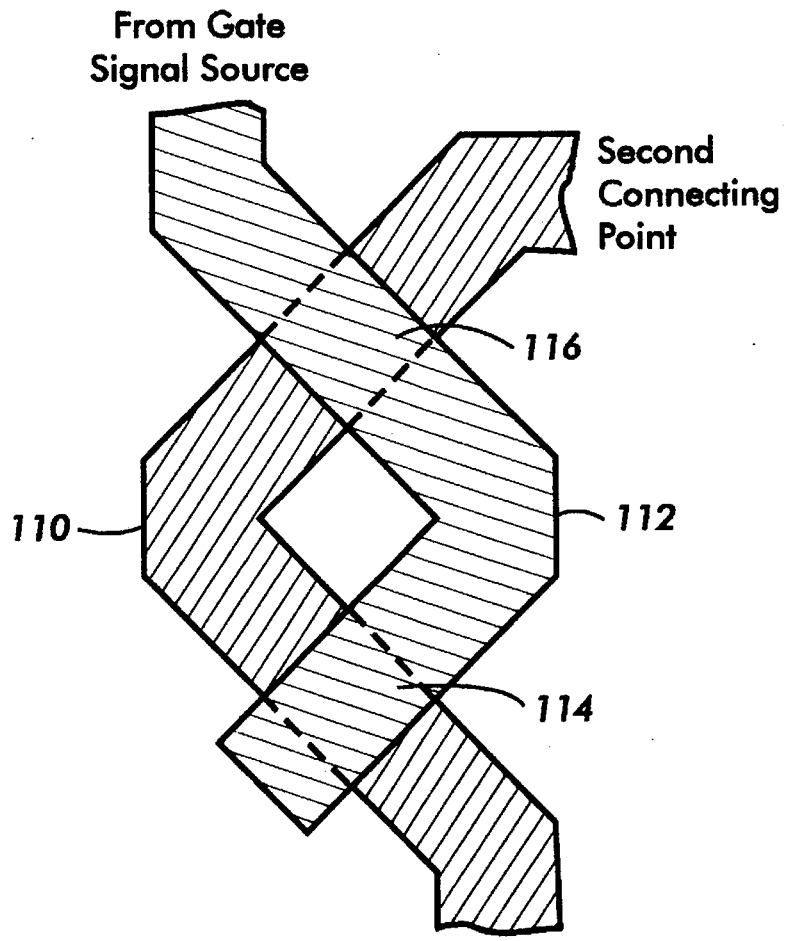
FIG. 6 is a schematic layout diagram of an alternative configuration to that in FIG. 3.
Figure 7:
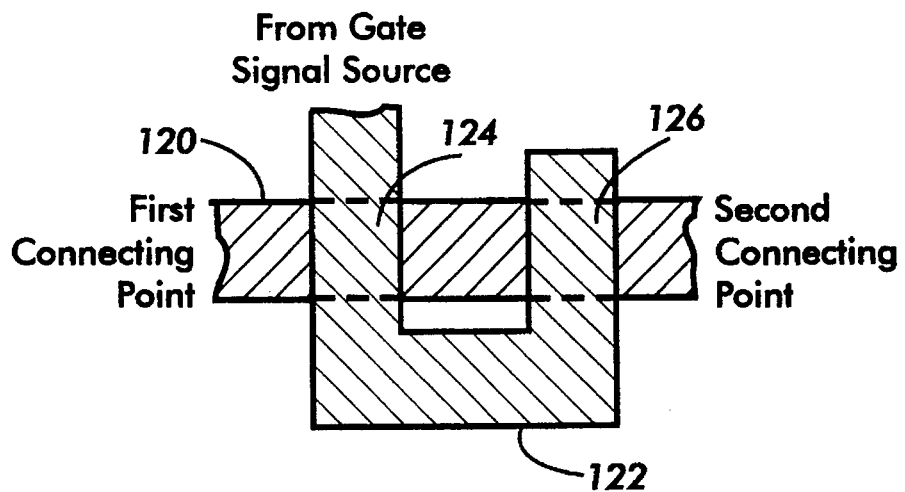
FIG. 7 is a schematic layout diagram of another alternative configuration.
Figure 8:
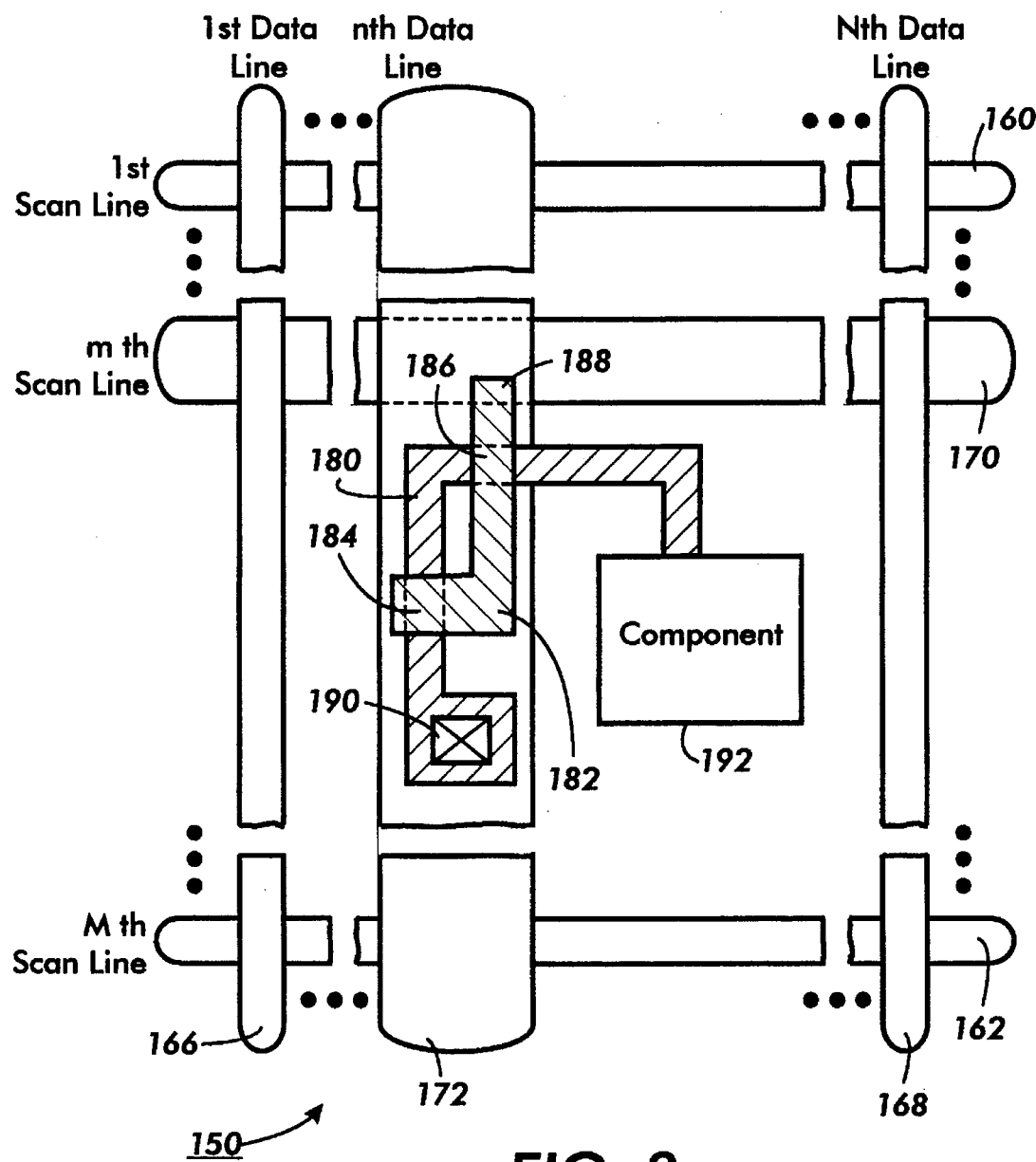
FIG. 8 is a schematic layout diagram of an array with cell circuitry like that in FIG. 3.

FIGS. 3–8 show general features of the invention. FIG. 3 shows a layout in which a semiconductor line extends between first and second connecting points and in which a conductive line that crosses the semiconductor line at two channels provides a gate signal that controls conductivity of the semiconductor line. FIGS. 4 and 5 show cross sections of FIG. 3. Each of FIGS. 6 and 7 shows a semiconductor line and a conductive line as in FIG. 3, but with a different configuration. FIG. 8 shows schematically an M×N array in which a cell's circuitry includes a layout like that in FIG. 3.

Line 70 in FIG. 3 extends between first and second connecting points at which line 70 is electrically connected to other components. Line 70 is in a layer of circuitry that includes semiconductor material.

Line 72 is in another layer of circuitry, and is connected to receive a gate signal. Line 72 crosses line 70 at channels 80 and 82, between which each line is L-shaped because it includes a 90° angle. The distinctive configuration in FIG. 3 can therefore be referred to as a "Crossed L."

FIG. 4 shows a cross section of FIG. 3 along line A—A. As shown, substrate 90 has surface 92 at which circuitry 94 is formed. Circuitry 94 may include one or more layers below semiconductor line 70, and may also include one or more layers between semiconductor line 70 and conductive line 72, such as an insulating layer. Conductive line 72 conducts gate signals to channel region 96. Circuitry 94 may also include one or more layers over conductive line 72.

FIG. 5 shows a cross section of FIG. 3 along line B—B. As shown, semiconductor line 70 includes channel 82 in channel region 96. Channel 82 can be undoped or very lightly doped, as indicated by $\rho^-$, indicating a low density of charge carrier sources and destinations. In contrast, channel leads 100 and 102 are heavily doped, as indicated by $\rho^+$, indicating a high density of charge carrier sources and destinations.

Channel 80 also has cross sections like those in FIGS. 4 and 5. Therefore, due to the positioning of charge carrier sources and destinations in line 70 as shown in FIG. 5, the gate signal conducted to each channel region by line 72 controls conductivity of line 70 between the first and second connecting points.

FIG. 6 shows a tilted Crossed L configuration in which each channel can have cross sections like those in FIGS. 4 and 5. Semiconductor line 110 extends between first and second connecting points. Conductive line 112 is connected to receive a gate signal. Line 112 crosses line 110 at channels 114 and 116, between which each line is L-shaped because it includes a 90° angle.

FIG. 7 shows another configuration in which each channel can have cross sections like those in FIGS. 4 and 5. Semiconductor line 120 extends between first and second connecting points. Conductive line 122 is connected to receive a gate signal. Line 122 crosses line 120 at channels 124 and 126, between which line 122 includes two 90° angles.

Array 150 in FIG. 8 includes M scan lines, from first scan line 160 through Mth scan line 162, and N data lines, from first data line 166 through Nth data line 168. Cell circuitry connected to mth scan line 170 and nth data line 172 is illustratively shown in more detail.

As shown in FIG. 8, semiconductor line 180 and conductive line 182 form an Crossed-L configuration, with line 182 crossing line 180 at channels 184 and 186. Line 182 has end 188 electrically connected to mth scan line 170, which provides a gate signal. Semiconductor line 180 is connected between data line connecting point 190, which can include a through metal connection, and a data lead of component 192. Because line 182 is conductive, the gate signal on mth scan line 170 controls conductivity of line 180 between connecting point 190 and the data lead of component 192.

D. Implementation

The general features described above could be implemented in numerous ways. An implementation described below employs poly-Si TFTs, and is suitable for an AMLCD array.

D.1. Cell Circuitry

Figure 9:
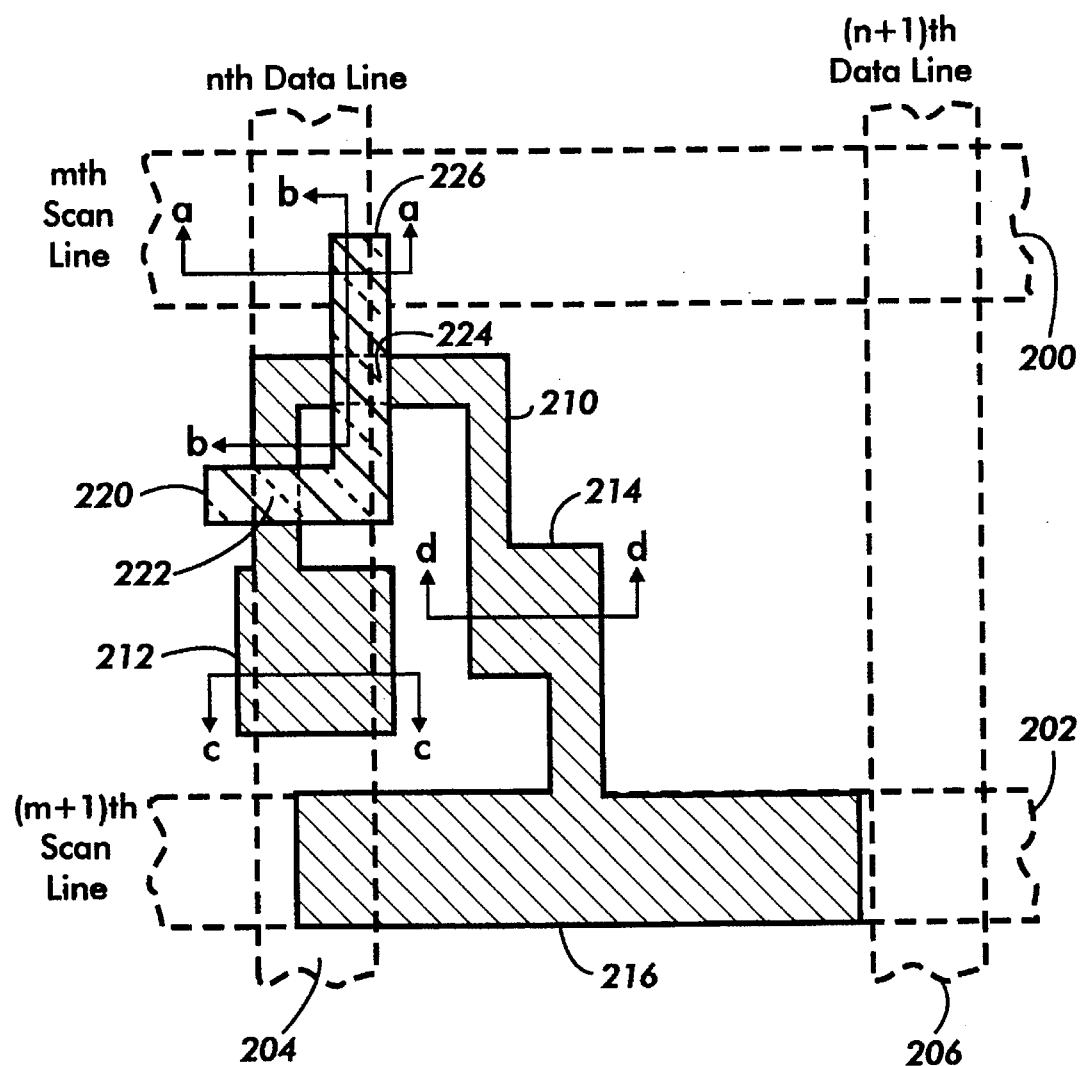
FIG. 9 is a schematic layout diagram showing semiconductor layers in a cell's circuitry.

FIGS. 9–13 illustrate cell circuitry. FIG. 9 shows a layout of first and second semiconductor layers. FIGS. 10–13 show representative cross sections of cell circuitry in FIG. 9, along lines a—a, b—b, c—c, and d—d, respectively.

FIG. 9 shows a part of an M×N array, with mth scan line 200, (m+1)th scan line 202, nth data line 204, and (n+1)th data line 206 in dashed lines. FIG. 9 also shows part of the cell circuitry for the cell that is connected to mth scan line 200 and nth data line 204.

The cell's circuitry includes first semiconductor pattern 210, with a line that extends from first connecting point 212 to second connecting point 214 and with another line extending from second connecting point 214 to capacitor electrode 216. First connecting point 212 is substantially all within the edges of nth data line 204, to which it is electrically connected. The edges of capacitor electrode 216 are aligned with the edges of (m+1)th scan line 202, forming a capacitive element.

The cell's circuitry also includes second semiconductor pattern 220, a line that crosses first semiconductor pattern 210 at channels 222 and 224. Second semiconductor pattern 220 extends from end 226, at which it is electrically connected to mth scan line 200.

The layout in FIG. 9 is designed to have the following dimensions when implemented with poly-Si TFTs on an insulating substrate: Each cell is 30 μm×30 μm, of which the scan line occupies 6 μm and the data line occupies 5 μm. The lines in first semiconductor pattern 210 are 2 μm wide, and second semiconductor pattern 220 is 2.5 μm wide. In general, the smallest features are 2 μm and the smallest separations are 3 μm, with 1.0 μm overlay and an aperture ratio of 49.7%.

The cell circuitry in FIG. 9 is designed so that the capacitive element formed by (m+1)th scan line 202 and capacitor electrode 216 has sufficient capacitance that stored voltages are not significantly affected by capacitive coupling with data line voltage fluctuations. Dark matrix is used to improve image quality by blocking stray illumination, as at edges, with minimum sacrifice of aperture.

Figure 10:
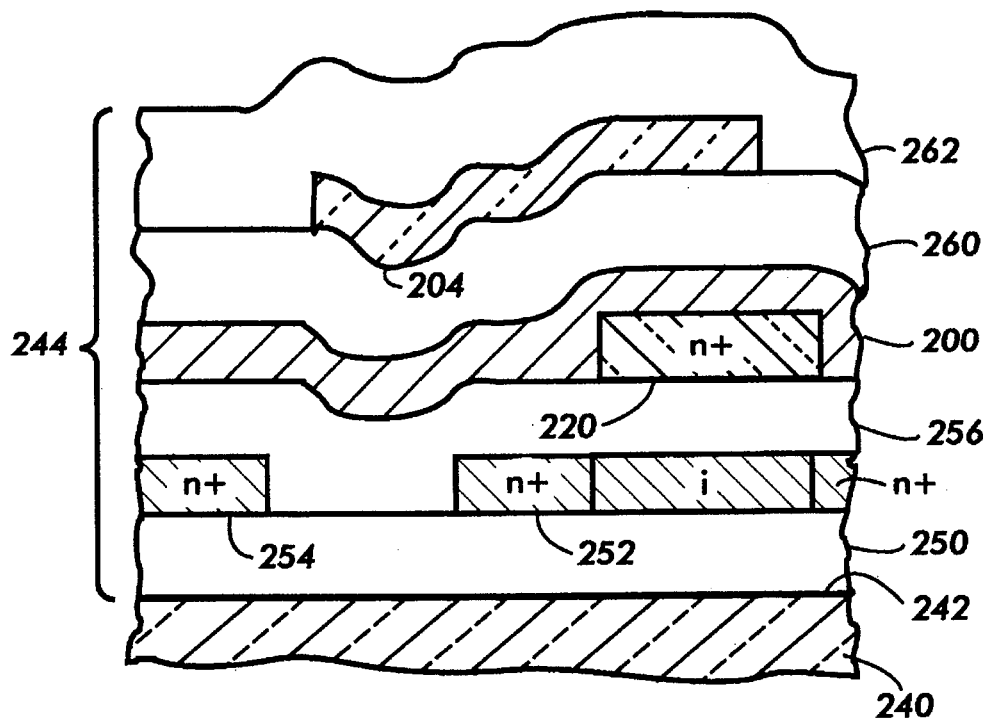
FIG. 10 is a schematic cross section along line a—a in FIG. 9.

FIG. 10 shows substrate 240, which can be quartz, with surface 242 at which circuitry 244 is formed. Circuitry 244 includes insulating layer 250 on surface 242, on which capacitor electrodes 252 and 254 are formed for the cell circuitry connected to the (m−1)th scan line and to the nth and (n−1)th data lines respectively. Capacitor electrodes 252 and 254 each include heavily n-doped poly-Si, as indicated by "n+," except that a small area of electrode 252 that is under second semiconductor pattern 220 is undoped, intrinsic poly-Si, as indicated by "i." If the area in which second semiconductor pattern 220 overlaps capacitor electrode 252 is small, as in FIG. 9, this small undoped area has an insignificant effect on capacitance.

Circuitry 244 also includes insulating layer 256 between capacitor electrodes 252 and 254 and second semiconductor pattern 220 shown in FIG. 9. Second semiconductor pattern 220 also includes heavily n-doped poly-Si, and is electrically connected to mth scan line 200, which includes aluminum, and which can be implemented as a hybrid TiW/AlCu stack. Because of the small overlap with second semiconductor pattern 220 and because of a slight dip between capacitor electrodes 252 and 254, mth scan line has slight variations in cross section, but in general its cross section remains substantially uniform across the array.

Circuitry 244 then includes insulating layer 260 separating mth scan line 200 from nth data line 204, which can also be implemented as a hybrid TiW/AlCu stack. Over nth data line 204 is passivation layer 262 of polyimide.

Figure 11:
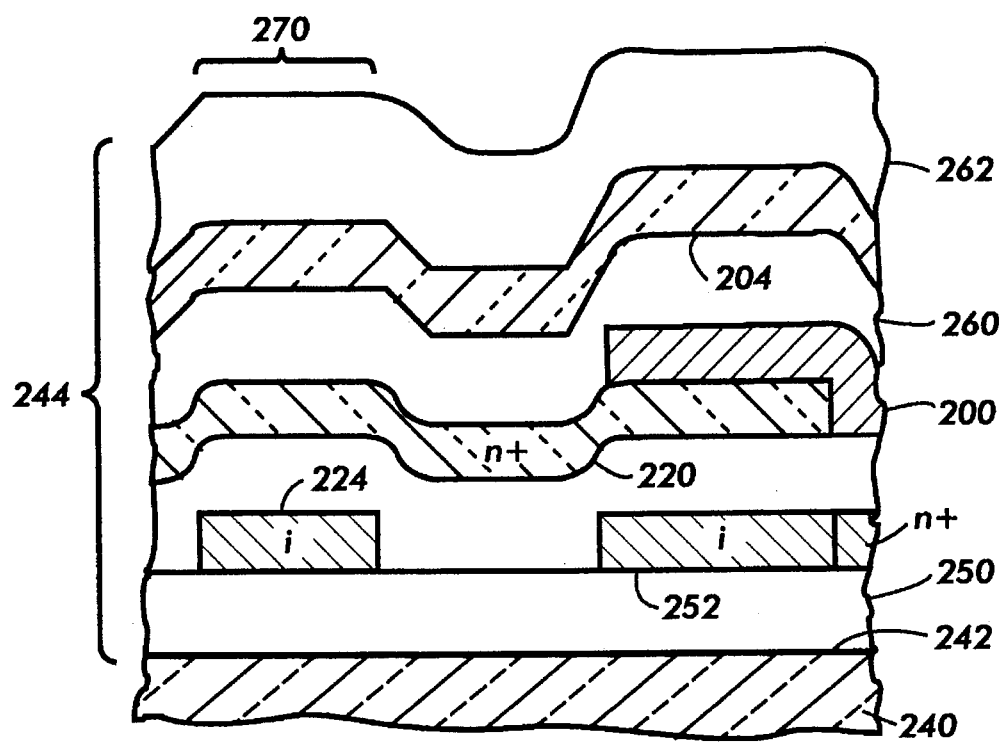
FIG. 11 is a schematic cross section along line b—b in FIG. 9.

FIG. 11 shows a different cross section of circuitry 244, with many of the same features as FIG. 10, but also showing channel 224 in first semiconductor pattern 210. As shown, second semiconductor pattern 220 provides signals from mth scan line 200 to channel region 270, controlling conductivity of channel 224.

Figure 12:
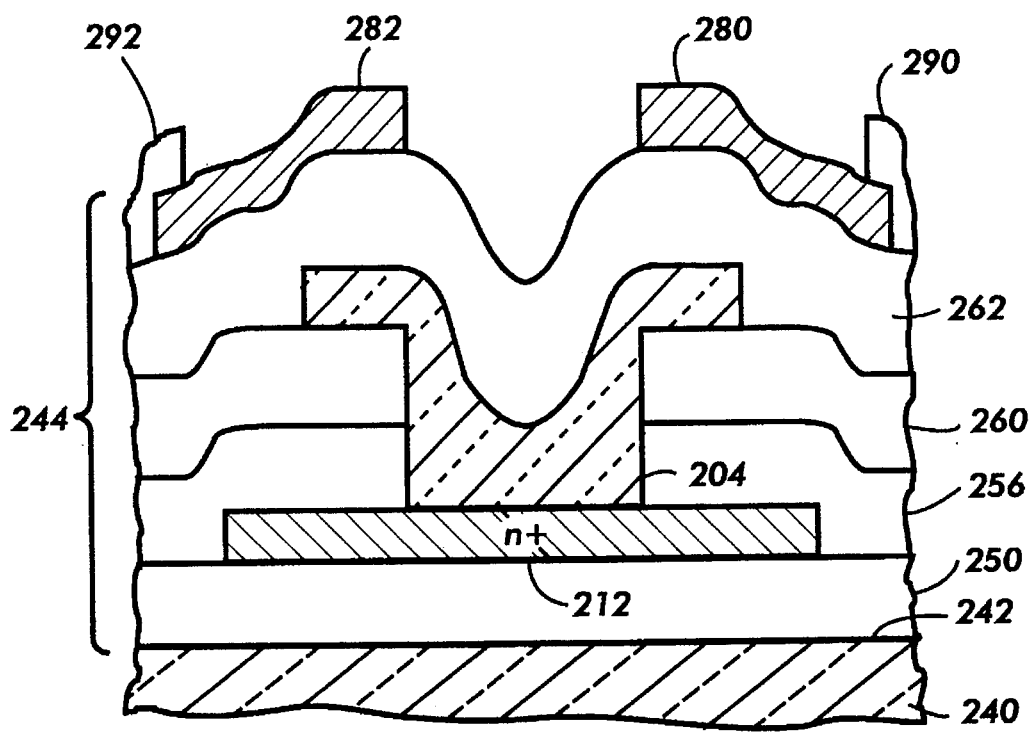
FIG. 12 is a schematic cross section along line c—c in FIG. 9.

FIG. 12 shows a cross section through first connecting point 212. As shown, nth data line 204 forms a metal/semiconductor contact with first semiconductor pattern 210 through an opening in insulating layers 256 and 260. Dark matrix lines 280 and 282 are formed on passivation layer 262 over the edges of nth data line 204, and indium tin oxide (ITO) pixel electrodes 290 and 292 slightly overlap dark matrix lines 280 and 282.

Figure 13:
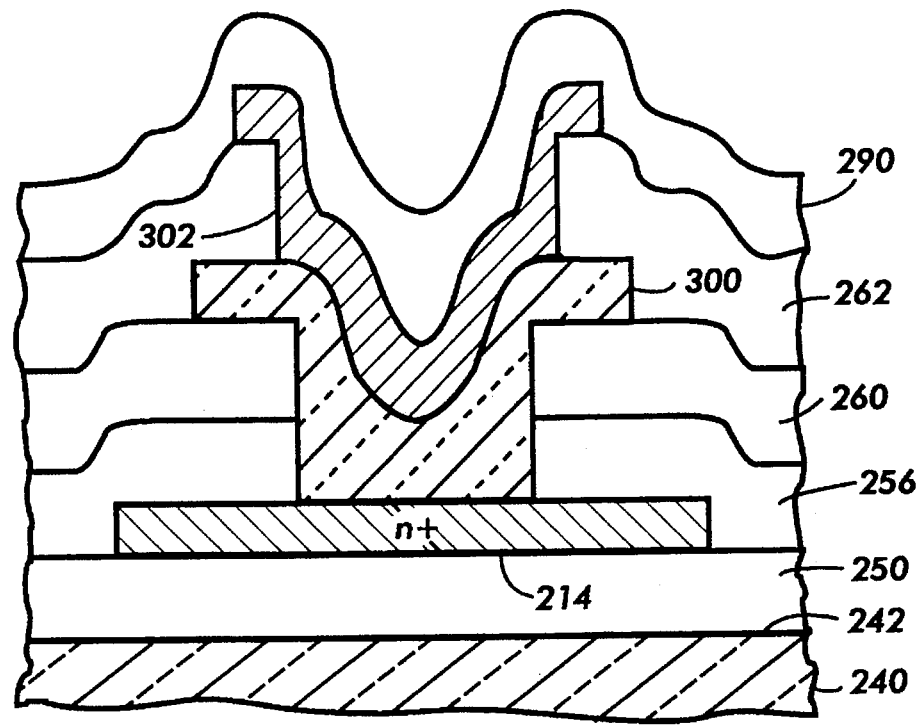
FIG. 13 is a schematic cross section along line d—d in FIG. 9.

FIG. 13 shows a cross section through second connecting point 214. Metal pattern 300 forms a metal/semiconductor contact with first semiconductor pattern 210 through an opening in insulating layers 256 and 260. Metal pattern 300 can be formed from the same metal layer as nth data line 204. Conductive dark matrix pattern 302 can be formed from the same material as dark matrix lines 280 and 282 in FIG. 12. ITO pixel electrode 290 then forms an electrical connection with second connecting point 214 through metal pattern 300 and dark matrix pattern 302. Although metal pattern 300 blocks stray illumination at the edges of insulating layers 256 and 260 and smooths the topology, dark matrix pattern 302 provides process compatibility between ITO pixel electrode 290 and metal pattern 300.

D.2. Fabrication

Figure 14:
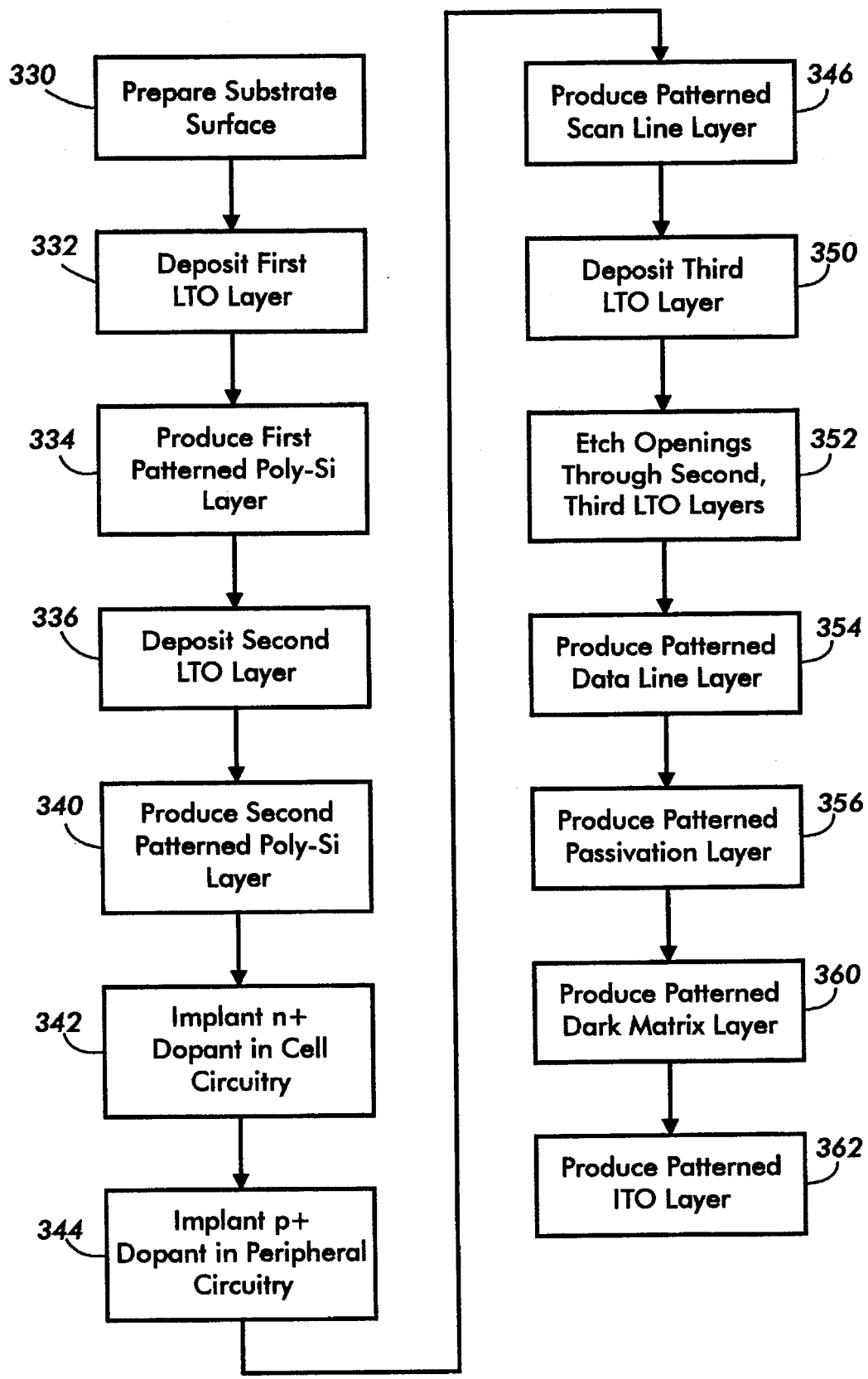
FIG. 14 is a flow chart showing acts in producing cell circuitry as in FIG. 9.

FIG. 14 shows acts in producing cell circuitry as described above. The act in box 330 begins by preparing a surface of a quartz substrate. The act in box 330 can include any necessary cleaning.

The act in box 332 then deposits a first layer of low temperature oxide (LTO), which can be $SiO_2$ deposited with plasma chemical vapor deposition. The first LTO layer can be deposited to a thickness of 0.7 μm and then annealed.

The act in box 334 deposits a layer of a-Si to a thickness of 0.1 μm, then performs Si self-ion implantation to enhance performance. The act in box 334 also performs crystallization and annealing at 600° C. As a result, the a-Si becomes poly-Si. The act in box 334 performs lithography to produce a pattern of mask material that covers the parts of the poly-Si that form first semiconductor pattern 210. Then, the act in box 334 etches to remove areas not covered by the pattern of mask material, leaving first semiconductor pattern 210.

The act in box 336 deposits a second layer of LTO to a thickness of 0.085 μm. The act in box 336 also performs oxidation at 950° C. under 150 atmospheres and anneals the second LTO layer.

The act in box 340 deposits a layer of poly-Si to a thickness of 0.35 μm. The act in box 340 performs lithography to produce a pattern of mask material that covers the parts of the poly-Si that form second semiconductor pattern 220 or another similar pattern that crosses the first semiconductor pattern at one or two channels. Then, the act in box 340 etches to remove areas not covered by the pattern of mask material, leaving second semiconductor pattern 220. Then, the act in box 340 removes the mask material.

The act in box 342 performs lithography to produce a pattern of mask material that does not cover the cell circuitry, but may, for example, cover areas in which peripheral circuitry is being formed on the substrate. The act in box 342 then implants a heavy concentration of an n-type dopant, making second semiconductor pattern 220 conductive and forming conductive leads in first semiconductor pattern 210. Then, the act in box 342 removes the mask material by an appropriate plasma resist etching.

The act in box 344 similarly performs lithography to produce a pattern of mask material that does not cover the peripheral circuitry, but covers the cell circuitry. The act in box 344 then implants a heavy concentration of a p-type dopant to form conductive areas in the peripheral circuitry. Then, the act in box 344 removes the mask material. The act in box 344 can also perform crystallization annealing at 600° C.

Because they implant heavy concentrations of dopants, the acts in boxes 342 and 344 may employ any of a number of implantation processes, including non-mass selection processes such as ion showering, plasma extraction, ion bucket, and so forth.

The act in box 346 deposits a layer of metal to a thickness of 0.1–0.2 µm to produce a scan line layer. The scan line layer can, for example, be a hybrid TiW/AlCu multilayer stack with three or four layers of 0.01 µm of TiW separated by two or three layers of 0.05 of AlCu, similar to the multilayer metal lines described in copending, coassigned U.S. patent application Ser. No. 08/234,897, now issued as U.S. Pat. No. 5,518,805, entitled "Hillock-Free Multilayer Metal Lines for High Performance Thin Film Structures," incorporated herein by reference. The hybrid films can be sputtered or evaporated using two alloy targets, alternating between the targets. These thicknesses avoid hillock formation in the AlCu layers during processing, yet provide a thin barrier metal to avoid intermixing between the AlCu layers or between an AlCu layer and other layers, avoiding hillock formation, film bubbling, peeling, or spiking into a poly-Si layer, for example. The films can all be wet etched at approximately the same rate to achieve a high degree of dimension control. The ratio of the wet TiW etchant to the wet AlCu etchant can be approximately 50:1; in contrast to the standard Al etchant, this mixed etchant is much lower in viscosity and less violent during etching, removing bubbling.

The act in box 346 then performs lithography to produce a pattern of mask material that covers the parts of the scan line layer that form the scan lines. Then, the act in box 346 etches to remove areas not covered by the pattern of mask material, leaving the scan lines. Then, the act in box 346 removes the mask material.

The act in box 350 deposits a third layer of LTO to a thickness of 0.7 µm. The act in box 350 also performs hydrogenation to passivate the channels in first semiconductor pattern 210 and an appropriate wet oxide etch to remove the damaged layer resulting from the hydrogenation process. This hydrogenation does not cause degradation of channels in first semiconductor pattern 210 because the scan lines formed in box 346 are not over the channels in first semiconductor pattern 210.

The act in box 352 performs lithography to produce a pattern of mask material that does not cover first and second connection points 212 and 214 and any other areas in which metal in the data line layer contacts the layer formed in box 334, but covers all other areas. The act in box 352 then etches to form openings in the second and third LTO layers from boxes 336 and 350 in the areas that are not covered. Then, the act in box 352 removes the mask material.

The act in box 354 deposits a data metal layer to a thickness of 0.5 µm. The data metal layer can, for example, be a hybrid TiW/AlCu multilayer stack as described above. The act in box 354 then performs lithography to produce a pattern of mask material that covers the parts of the data line layer that form the data lines and that cover the opening to second connection point 214. Then, the act in box 354 etches to remove areas not covered by the pattern of mask material, leaving the data lines. Then, the act in box 354 removes the mask material.

The data line layer over second connection point 214 blocks light leakage due to poor liquid crystal control as a result of the steepness of the topology. This light leakage blocking raises contrast ratio dramatically.

The act in box 356 deposits a passivation layer of polyimide to a thickness of 1.5 µm. The act in box 356 performs lithography to produce a pattern of mask material that does not cover second connection point 214 and any other areas in which metal in the data line layer should be exposed for contact. The act in box 356 then etches to form openings in the passivation layer in the areas that are not covered. Then, the act in box 356 removes the mask material.

The passivation layer also acts to planarize the surface, and spin-on glass could be used instead of polyimide. Planarization is important because of the steepness of the topology.

The act in box 360 deposits a dark matrix layer of TiW to a thickness of 0.1 µm. TiW is advantageous as a dark matrix material because it acts as a mutual etch stop with indium-tin-oxide (ITO) and aluminum and has a high optical density even in a thin layer, and it is advantageously applied over the circuitry rather than on a cover sheet. The act in box 360 performs lithography to produce a pattern of mask material that covers the dark matrix layer only in areas in which light shielding is needed, such as along the edges of each data line and around second connection point 214. The act in box 360 then etches to remove the areas that are not covered. Then, the act in box 360 removes the mask material.

The act in box 362 deposits ITO to a thickness of 0.055 µm. The act in box 362 performs lithography to produce a pattern of mask material that covers the ITO layer in light transmissive cell areas. The act in box 362 then etches to remove the areas that are not covered. Then, the act in box 362 removes the mask material and anneals the ITO layer at 280° C.

D.3. Display

Figure 15:
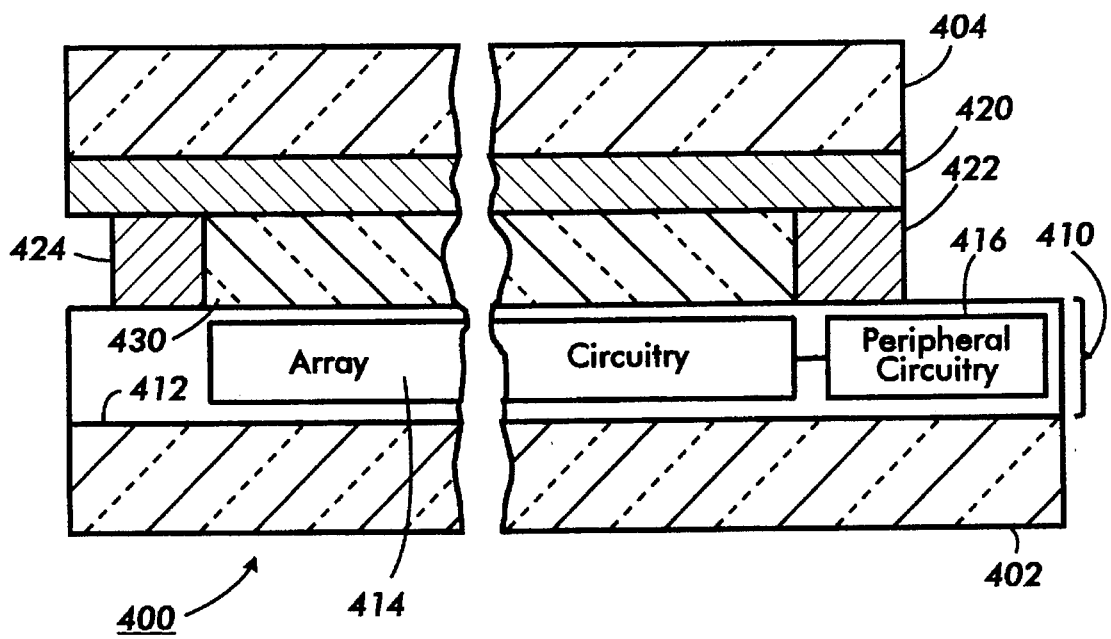
FIG. 15 is a cross section of a display that includes an array produced as shown in FIG. 14.

FIG. 15 shows features of a display that includes circuitry produced as described above.

Display 400 in FIG. 15 includes array substrate 402 and cover substrate 404. Array substrate 402 is quartz, but cover substrate 404 could be quartz or glass.

Circuitry 410 formed at surface 412 of array substrate 402 includes array circuitry 414 and peripheral circuitry 416. Peripheral circuitry 416 is outside the boundary of array circuitry 414, and can include drivers connected to the ends of scan lines and data lines. As described above, array circuitry 414 can have n-doped poly-Si TFTs, while peripheral circuitry 416 can have p-doped poly-Si TFTs.

ITO layer 420 is formed at a surface of cover substrate 404 and faces surface 412 of array substrate 402, separated by spacers 422 and 424 at the boundary of array circuitry 414. If display 400 is a projection device, it should be small enough that no other spacers are needed within the boundary of array circuitry 414, because spacers can cause image problems in a projection display. The need for spacers can be reduced by using thicker substrates and by assembling at lower temperatures.

Display 400 also includes liquid crystal material 430 in the cavity defined by ITO layer 420, array circuitry 414, and spacers 422 and 424. Liquid crystal material 430 can be a 90° twisted nematic liquid crystal.

Display 400 could, for example, be a wafer-scale projection display of approximately 1.5" diagonal. Display 400 could alternatively be a large area direct viewing display.

Display 400 can be assembled using techniques like those described in copending, coassigned U.S. patent application Ser. No. 08/235,011, now issued as U.S. Pat. No. 5,491,347 entitled "Thin-Film Structure with Dense Array of Binary Control Units for Presenting Images," incorporated herein by reference.

D. 4. Results

The techniques described above have been simulated and compared with prior art techniques. Simulation results have shown significantly reduced cross talk and improved image quality, in part due to much larger storage capacitance and in part due to smaller gate and parasitic capacitances in the TFTs.

A dummy 30×30 array of cells with no liquid crystal assembly has been manufactured, tested, and found to be fully functional.

1280×1024 arrays have been successfully manufactured, both wafer-scale and large area. The wafer-scale arrays employ conventional 2 μm CMOS technology, while the large area arrays employ conventional 3 μm CMOS technology.

Results to date indicate that the wafer-scale and large area arrays will be fully functional when assembled and that the circuitry is scalable to 1 μm or smaller CMOS technology.

D.5. Variations

The implementation described above provides thin film circuitry on an insulating substrate. The invention could be implemented with other types of circuitry on other types of substrates.

The implementation described above provides circuitry with specific geometric and electric characteristics, but the invention could be implemented with different geometries and with different circuitry.

The implementation described above includes layers of specified thicknesses, produced from specified materials by specified processes, but other thicknesses could be produced, and other materials and processes could be used, such as thinner semiconductor and gate oxide layers to improve TFT performance or to increase storage capacitance. For example, rather than CMOS TFTs, the processes could produce metal oxide semiconductor field effect transistors (MOSFETs) or junction field effect transistors (JFETs). In some instances, an insulating layer between the gate line and the channel is not necessary for isolation, because adequate isolation results from the junction between materials. Rather than poly-Si, other semiconductor materials could be used in the semiconductor layers, including but not limited to a-Si, SiGe, CdSe, or a composite layer of poly-Si and SiGe. Similarly, various conductive materials could be used in the scan lines and data lines, including but not limited to ITO, MoTa, Cr, MoCr, Ta, Cu, Ti, TiN, and organic conductive materials.

The implementation described above includes layers in a specific sequence, but the sequence of layers could be modified, such as by producing bottom gate TFT structures. For example, each gate line could cross under channels rather than over them.

The implementation described above forms a semiconductor line that is heavily doped except in channels at which it crosses a gate line, but other doping techniques could be used. For example, doping could be lowered to reduce leakage current as described in copending, coassigned U.S. patent application Ser. No. 08/277,719, entitled "Reduced Leakage Current Multiple Gate Thin Film Transistors," incorporated herein by reference.

The implementation described above forms an array with a metal scan line controlling a semiconductor gate line in accordance with the invention described in copending, coassigned U.S. patent application Ser. No. 08/368,123, now continued as 08/572,357, entitled "Array with Metal Scan Lines Controlling Semiconductor Gate Lines," incorporated herein by reference. The invention could, however, be implemented to form other circuitry.

The implementation described above forms an array with a metal scan line controlling a semiconductor gate line in accordance with the invention described in copending, coassigned U.S. patent application Ser. No. 08/367,983, entitled "Forming Array with Metal Scan Lines to Control Semiconductor Gate Lines," incorporated herein by reference. The invention could, however, be implemented with other techniques.

E. Application

The invention could be applied in many ways, including arrays for displays, sensors, and light valves.

F. Miscellaneous

The invention has been described in relation to thin-film implementations, but the invention might be implemented with single crystal technology.

Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed:

1. A product comprising:

a substrate with a surface at which circuitry can be formed; and circuitry formed at the surface of the substrate; the circuitry comprising:

a first line extending between first and second connecting points at which the first line is electrically connected to other components; the first line being in a first layer of the circuitry; the first layer comprising semiconductor material;

a second line in a second layer of the circuitry; and a third line providing a gate signal;

the second line being connected to receive the gate signal from the third line at a first end of the second line; the second line extending with a substantially constant width along a length from the first end to a second end; the second line crossing the first line in channel regions at least twice along its length between the first and second ends; the first line including a channel in each channel region, the channels being in series between the first and second connecting points; the second line conducting the gate signal to all of the channel regions;

the first line including charge carrier sources and destinations positioned so that conductivity of the first line between the first and second connecting points is controlled by the gate signal conducted to the channel regions by the second line.

2. The product of claim 1 in which the substrate is an insulating substrate.

3. The product of claim 1 in which the circuitry is thin film circuitry.

4. The product of claim 1 in which the second layer of the circuitry comprises semiconductor material.

5. The product of claim 4 in which the second layer comprises polysilicon.

6. The product of claim 1 in which the first layer comprises polysilicon.

7. The product of claim 1 in which the first line comprises a first density of charge carrier sources and destinations in the channel regions and a second density of charge carrier sources and destinations in areas other than the channel regions; the second density being much greater than the first density.

8. The product of claim 1, further comprising an insulating layer between the first and second layers in each of the channel regions.

9. The product of claim 1 in which the channel regions are substantially the same in size and shape.

10. The product of claim 1 in which the first line has a first width in each channel region and the second line has a second width in each channel region; the first and second widths being approximately equal.

11. The product of claim 1 in which each channel region is rectangular, the first line and the second line being perpendicular in each channel region.

12. A product comprising:

a substrate with a surface at which circuitry can be formed; and circuitry formed at the surface of the substrate; the circuitry comprising:

a first line extending between first and second connecting points at which the first line is electrically connected to other components; the first line being in a first layer of the circuitry; the first layer comprising semiconductor material;

a second line in a second layer of the circuitry; the second line being connected to receive a gate signal; the second line crossing the first line in two or more channel regions; the first line including a channel in each channel region, the channels being in series between the first and second connecting points; the second line being conductive so that the second line conducts the gate signal to all of the channel regions; the second layer of the circuitry comprising polysilicon semiconductor material; and a third line in a third layer of the circuitry; the third layer comprising conductive metal; the third line providing the gate signal; the second line having an end electrically connected to the third line;

the first line including charge carrier sources and destinations positioned so that conductivity of the first line between the first and second connecting points is controlled by the gate signal conducted to the channel regions by the second line.

13. A product comprising:

a substrate with a surface at which circuitry can be formed; and circuitry formed at the surface of the substrate; the circuitry comprising:

a first line extending between first and second connecting points at which the first line is electrically connected to other components; the first line being in a first layer of the circuitry; the first layer comprising semiconductor material;

a second line in a second layer of the circuitry; the second line being connected to receive a gate signal; the second line crossing the first line in two or more channel regions; the first line including a channel in each channel region, the channels being in series between the first and second connecting points; the second line being conductive so that the second line conducts the gate signal to all of the channel regions; the second layer of the circuitry comprising conductive metal; and a third line in the second layer; the third line providing the gate signal; the second and third lines being electrically connected;

the first line including charge carrier sources and destinations positioned so that conductivity of the first line between the first and second connecting points is controlled by the gate signal conducted to the channel regions by the second line.

14. A product comprising:

a substrate with a surface at which circuitry can be formed; and circuitry formed at the surface of the substrate; the circuitry comprising:

a first line extending between first and second connecting points at which the first line is electrically connected to other components; the first line being in a first layer of the circuitry; the first layer comprising semiconductor material;

a second line in a second layer of the circuitry; the second line being connected to receive a gate signal; the second line crossing the first line in two or more channel regions; the first line including a channel in each channel region, the channels being in series between the first and second connecting points; the second line being conductive so that the second line conducts the gate signal to all of the channel regions; the first and second lines crossing in first and second channel regions, the first line extending in a first direction through the first channel region and in a second direction perpendicular to the first direction through the second channel region; the second line extending in the first direction through the second channel region and in the second direction through the first channel region;

the first line including charge carrier sources and destinations positioned so that conductivity of the first line between the first and second connecting points is controlled by the gate signal conducted to the channel regions by the second line.

15. The product of claim 14 in which each of the first and second lines includes an angle of approximately 90° between the first and second channel regions.

16. An array comprising:

a substrate with a surface at which circuitry can be formed; and array circuitry formed at the surface of the substrate, the array circuitry comprising:

a set of M scan lines, where M is greater than 1; each of the scan lines extending approximately in a first direction across the surface of the substrate; the M scan lines being positioned in order from first through Mth;

a set of N data lines, where N is greater than 1; each of the data lines extending approximately in a second direction across the surface of the substrate; the second direction being different than the first direction; the N data lines being positioned in order from first through Nth;

for each value of m from 1 through M and for each value of n from 1 through N, a crossing region in which the mth scan line and the nth data line cross;

for each of a set of one or more of the crossing regions, cell circuitry connected to the mth scan line and the nth data line; the cell circuitry of each crossing region in the set comprising:

a component having a data lead for receiving signals from or providing signals to the nth data line;

a first line extending between a first connecting point at which the first line is electrically connected to the nth data line and a second connecting point at which the first line is electrically connected to the data lead of the component; the first line being in a first layer of the array circuitry; the first layer comprising semiconductor material; and a second line in a second layer of the array circuitry; the second line being connected to receive a gate signal from the mth scan line; the second line crossing the first line in two or more channel regions; the first line including a channel in each channel region, the channels being in series between the first and second connecting points; the second line being conductive so that the second line conducts the gate signal to all of the channel regions;

the first line including charge carrier sources and destinations positioned so that conductivity of the first line between the first and second connecting points is controlled by the gate signal conducted to the channel regions by the second line.

17. The array of claim 16 in which the mth scan line comprises aluminum.

18. The array of claim 16 in which the component comprises a capacitive element.

19. The array of claim 16 in which the mth and (m+1)th scan lines and the nth and (n+1)th data lines bound a cell area; the component comprising a cell electrode in the cell area; the cell electrode being connected to the data lead.

20. The array of claim 19 in which the cell electrode is light transmissive.

21. The array of claim 16 in which the nth data line has a width in the first direction between first and second edges and the channel regions are between the first and second edges.

22. The array of claim 21 in which the first line is between the nth data line and the substrate.

23. The array of claim 21 in which the second line is substantially all between the first and second edges; the second line being connected to the mth scan line in the crossing region.

24. A display comprising:

a substrate with a surface at which circuitry can be formed;

array circuitry formed at the surface of the substrate, the array circuitry comprising:

a set of M scan lines, where M is greater than 1; each of the scan lines extending approximately in a first direction across the surface of the substrate; the M scan lines being positioned in order from first through Mth;

a set of N data lines, where N is greater than 1; each of the data lines extending approximately in a second direction across the surface of the substrate; the second direction being different than the first direction; the N data lines being positioned in order from first through Nth;

for each value of m from 1 through M and for each value of n from 1 through N, a crossing region in which the mth scan line and the nth data line cross;

for each of a set of one or more of the crossing regions, cell circuitry connected to the mth scan line and the nth data line; the cell circuitry of each crossing region in the set comprising:

a component having a data lead for receiving signals from the nth data line; the mth and (m+1)th scan lines and the nth and (n+1)th data lines bounding a cell area; the component comprising a light transmissive cell electrode in the cell area; the cell electrode being connected for receiving signals from the data lead;

a first line extending between a first connecting point at which the first line is electrically connected to the nth data line and a second connecting point at which the first line is electrically connected to the data lead of the component; the first line being in a first layer of the array circuitry; the first layer comprising semiconductor material; and a second line in a second layer of the array circuitry; the second line being electrically connected to the mth scan line to receive a gate signal; the second line crossing the first line in two or more channel regions; the first line including a channel in each channel region, the channels being in series between the first and second connecting points; the second line being conductive so that the second line conducts the gate signal to all of the channel regions;

the first line including charge carrier sources and destinations positioned so that conductivity of the first line between the first and second connecting points is controlled by the gate signal conducted to the channel regions by the second line; and a liquid crystal material positioned along the cell electrode so that data signals received by the cell electrode from the nth data line control light transmissivity of the liquid crystal material; the data signals being received from the nth data line under control of the gate signal from the mth scan line.

* * * * *